United States Patent
Choi et al.

(10) Patent No.: US 11,452,218 B2
(45) Date of Patent: Sep. 20, 2022

(54) ROLLABLE DISPLAY DEVICE

(71) Applicant: Samsung Display Co., Ltd., Yongin-Si (KR)

(72) Inventors: Jinhwan Choi, Seoul (KR); Hyunwoo Koo, Hwaseong-si (KR); Taewoong Kim, Seongnam-si (KR); Dongwon Choi, Seoul (KR); Kachatryan Hayk, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 331 days.

(21) Appl. No.: 16/853,943

(22) Filed: Apr. 21, 2020

(65) Prior Publication Data
US 2020/0337161 A1    Oct. 22, 2020

(30) Foreign Application Priority Data

Apr. 22, 2019  (KR) .................. 10-2019-0046742
Apr. 14, 2020  (KR) .................. 10-2020-0045543

(51) Int. Cl.
| | |
|---|---|
| *H05K 5/00* | (2006.01) |
| *H01L 51/52* | (2006.01) |
| *H05K 5/02* | (2006.01) |
| *C09J 7/20* | (2018.01) |
| *B32B 7/12* | (2006.01) |

(Continued)

(52) U.S. Cl.
CPC ............. *H05K 5/0017* (2013.01); *B32B 7/12* (2013.01); *B32B 27/08* (2013.01); *C09J 7/20* (2018.01); *H01L 51/5237* (2013.01); *H05K 5/0217* (2013.01); *B32B 2457/20* (2013.01); *C09J 2423/00* (2013.01); *C09J 2425/00* (2013.01); *C09J 2433/00* (2013.01); *C09J 2461/00* (2013.01); *C09J 2463/00* (2013.01); *H01L 27/3244* (2013.01); *H01L 2251/5338* (2013.01)

(58) Field of Classification Search
CPC .... B32B 7/04; B32B 7/06; B32B 7/12; B32B 2457/20; B32B 2457/202; B32B 2457/206; C09J 5/00; C09J 5/02; C09J 5/04; C09J 2301/30; C09J 2301/312; C09J 2301/50; C09J 2301/502; H01L 51/0097; H01L 2251/5338; H05K 5/0017; H05K 5/0217
See application file for complete search history.

(56) References Cited

U.S. PATENT DOCUMENTS

| | | |
|---|---|---|
| 9,940,892 B2 | 4/2018 | Pang |
| 10,319,263 B2 | 6/2019 | Lee et al. |

(Continued)

FOREIGN PATENT DOCUMENTS

KR   10-2016-0068049   6/2016

*Primary Examiner* — Zachary M Davis
(74) *Attorney, Agent, or Firm* — F. Chau & Associates, LLC

(57) ABSTRACT

A display device includes a display module and a housing. At least one roller is disposed in the housing. The display module is configured to be wound on the at least one roller and to be inserted and drawn from the housing. The display module comprises a display panel, a window on the display panel and an adhesion layer between the display panel and the window. The adhesion layer comprises a first polymer layer having positive charges and a second polymer layer having negative charges. The second polymer layer is directly disposed on the first polymer layer.

20 Claims, 14 Drawing Sheets

(51) Int. Cl.
*B32B 27/08* (2006.01)
*H01L 27/32* (2006.01)

(56) References Cited

U.S. PATENT DOCUMENTS

2016/0155965 A1    6/2016  Kusuura
2016/0161983 A1*   6/2016  Lee .................... G09F 9/301
                                                      361/749
2021/0002516 A1*   1/2021  Akamatsu ................ C09J 7/38

* cited by examiner

ROLLABLE DISPLAY DEVICE

CROSS-REFERENCE TO RELATED APPLICATIONS

This application claims priority under 35 U.S.C. § 119 to Korean Patent Application No. 10-2019-0046742, filed on Apr. 22, 2019 in the Korean Intellectual Property Office, and Korean Patent Application No. 10-2020-0045543, filed on Apr. 14. 2020 in the Korean Intellectual Property Office, the disclosures of which are incorporated by reference in their entireties.

1. Technical Field

The present disclosure relates to a rollable display device, and more particularly, to a rollable display device, which is configured to reduce stress caused by a rolling operation and to have high reliability.

2. Discussion of Related Art

Flexible display devices include curved display devices having display surfaces that are configured to be curved to a fixed curvature, foldable display devices having display surfaces that are configured to be bent to a specific curvature radius or larger or to be bent along a folding axis, and rollable display devices that are configured to be rolled with a specific curvature radius. In particular, since rollable display devices have excellent portability in relation to the display area that is provided, many studies are being conducted to develop rollable display devices.

A display module of the reliable display device has a stacking structure, in which various elements are stacked on each other. Some of the elements may be separated from each other or may be cracked by a stress that occurs when the reliable display device is rolled.

SUMMARY

An exemplary embodiment of the present inventive concepts provides a reliable display device that reduces a stress that is applied to each of elements in a display module during a rolling operation, and thereby improves an operational reliability of the display device.

According to an exemplary embodiment of the present inventive concepts, a display device includes a display module and a housing. At least one roller is disposed in the housing. The display module is configured to be wound on the at least one roller and to lie inserted and drawn from the housing. The display module comprises a display panel, a window on the display panel and an adhesion layer between the display panel and the window. The adhesion layer comprises a first polymer layer having positive charges and a second polymer layer having negative charges. The second polymer layer is directly disposed on the first polymer layer.

In an exemplary embodiment, the adhesion layer may be directly disposed between the display panel and the window. The first polymer layer may include a cation polymer, which may be obtained by polymerizing at least one selected from monomers including a styrene group, a diene group, an acrylate group, an aldehyde group, an epoxide group, an acrylonitrile group, or a cyanoacryl group. The second polymer layer may include an anion polymer, which may be obtained by polymerizing at least one selected from monomers including an isobutylene group, a styrene group, a diene group, or a vinylalkylether. The adhesion layer may include an anion layer and a cation layer. The anion layer may be directly disposed on the first polymer layer and may be spaced apart from the second polymer layer. The cation layer may be directly disposed on the second polymer layer and may be spaced apart from the first polymer layer. The anion layer may include at least one of $OH^-$, $O^-$ or $O_2^-$. The cation layer may include at least one of $F^+$, $O^+$, $O_2^+$, $H^+$, $Ar^+$, or $N_2^+$.

In an exemplary embodiment, the at least one roller may include one roller, on which both of the display panel and the window are wound. The display device may further include at least one supplementary roller, which is spaced apart from the one roller to guide the display module.

In an exemplary embodiment, the housing may include a lower frame, an upper frame, and a side frame. The upper frame may be opposite to the lower frame, and an opening, into or from which the display module is inserted and drawn, may be defined in the upper frame. The side frame may be disposed between the lower frame and the upper frame.

In an exemplary embodiment, the at least one roller may include a first roller, a second roller, and a third roller. The window may be wound on the first roller, the display panel may be wound on the second roller, and the supporting substrate may be wound on the third roller.

In an exemplary embodiment, the adhesion layer may be directly disposed between the display panel and the window and between the supporting substrate and the display panel. When the display module is inserted into the housing, the first polymer layer and the second polymer layer may be separated from each other, and the display panel, the window, and the supporting substrate may be spaced apart front each other. When the display module is drawn from the housing, the first polymer layer and the second polymer layer may be adhered to each other, and the display panel, the window, and the supporting substrate may be combined to each other to form a single object.

In an exemplary embodiment, when viewed in a plan view, the first to third rollers may be spaced apart from each other in a first direction, which is a drawing direction of the display module. The first roller may be disposed between the second roller and the third roller. The first roller and the third roller may not be overlapped with the upper frame. A distance between the first roller and the second roller may be less than a distance between the second roller and the third roller. At least a portion of the second roller may be overlapped with the upper frame.

In an exemplary embodiment, the first to third rollers may be spaced apart from each other in a third direction, which is a thickness direction of the display module, and may be overlapped with at least a portion of the upper frame, when viewed in a plan view. A distance between the first roller and the lower frame may be less than a distance between the second roller and the lower frame. The distance between the second roller and the lower frame may be less than a distance between the third roller and the lower frame.

According to an exemplary embodiment of the present inventive concept, a display device includes a display module including a display panel, a window on the display panel, and an adhesion layer between the display panel and the window. The display device further includes a housing. The display module is configured to be inserted and drawn from the housing. A first roller is disposed in the housing and is configured to wind the window thereon. A second roller disposed in the housing and is configured to wind the display panel thereon. The adhesion layer comprises a first polymer layer having positive charges and a second polymer layer having negative charges. The second polymer layer is directly disposed on the first polymer layer.

In an exemplary embodiment, when the display module is inserted into the housing, the first polymer layer and the second polymer layer may be separated from each other, and the display panel and the window may be spaced apart from each other. When the display module is drawn from the housing, the first polymer layer and the second polymer layer may be adhered to each other, and the display panel and the window may be combined to form a single object.

In an exemplary embodiment, the display device may further include an ion-generation part. The ion-generation part may be disposed on the housing. The ion-generation part may provide positive and or negative ions to the display module, when the display module is inserted into the housing.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

Figure 1:
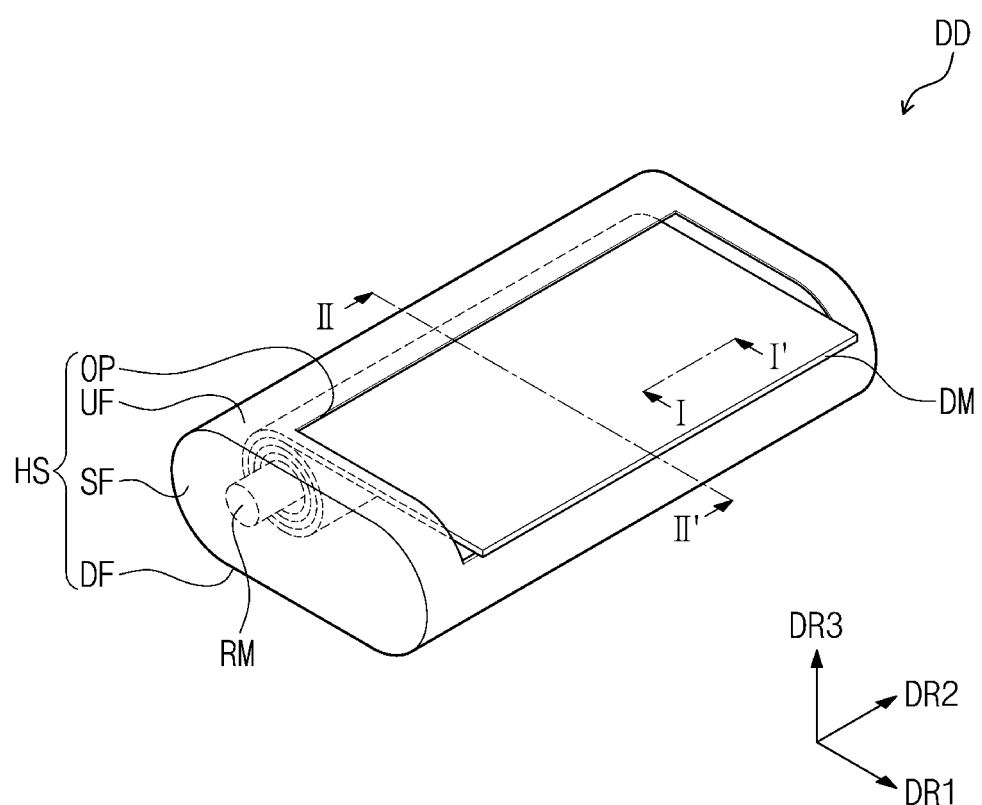
FIGS. 1 and 2 are perspective views illustrating a reliable display device according to exemplary embodiments of the present inventive concepts.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

Exemplary embodiments of the present inventive concepts will now be described more fully with reference to the accompanying drawings, in which exemplary embodiments are shown. Exemplary embodiments of the present inventive concepts may, however, be embodied in many different forms and should not be construed as being limited to the specific exemplary embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on", etc.).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from tire teachings of the exemplary embodiments.

Spatially relative terms, such as "beneath," "below," "lower," "above." "upper" and the like, may be used herein for ease of description to describe the relationship of an element(s) or feature(s) to another elements) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular exemplary embodiments only and is not intended to be limiting of the exemplary embodiments of the present inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the present inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the present inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the relevant art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
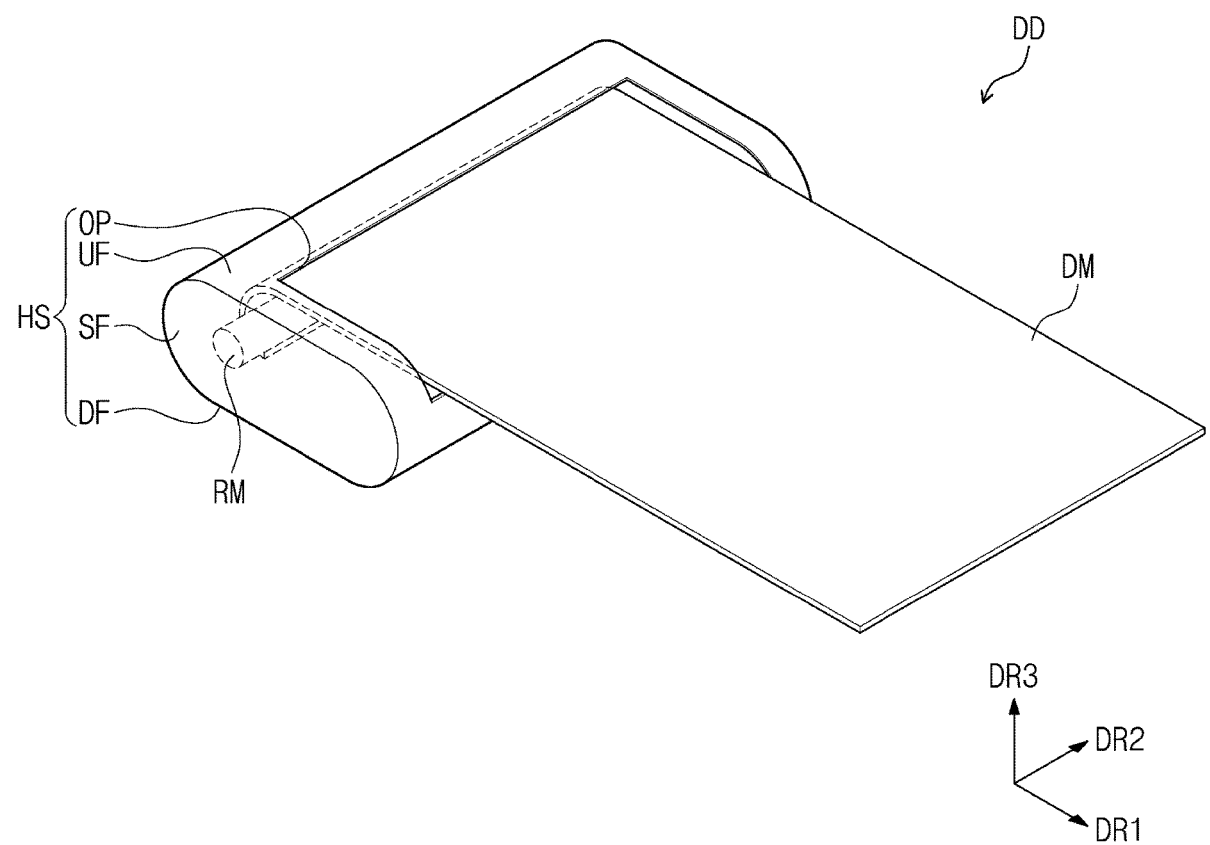

FIGS. 1 and 2 are perspective views, each of which schematically illustrates a display device DD according to exemplary embodiments of the present inventive concepts.

Referring to FIGS. 1 and 2, the display device DD according to an exemplary embodiment of the present inventive concepts may be a rollable display device. The display device DD may include a display module DM, a housing HS, and at least one roller RM.

The display module DM may provide an image. The display module DM will be described in more detail below.

The display module DM may be contained within the housing HS. For example, the display module DM may be inserted in or drawn (e.g., pulled out) from the housing HS. For example, FIG. 1 shows the display module DM inserted in the housing HS. FIG. 2 shows the display module DM drawn from the housing. As shown in the exemplary embodiments of FIGS. 1-2. the housing HS may include a lower frame DF, a side frame SF, an upper frame UF, and the at least one roller RM.

The lower frame DF may extend in a first direction DR1, which is a drawing direction of the display module DM, and a second direction DR2, which is not parallel to the first direction DR1. For example, in an exemplary embodiment, the second direction DR2 may be orthogonal to the first direction DR1. However, exemplary embodiments of the present inventive concepts are not limited thereto. The upper frame UF may face the lower frame DF and may also extend in a first direction DR1 and a second direction DR2. The housing HS includes an opening OP, through which the display module DM passes. In an exemplary embodiment, the opening OP may be defined in tire upper frame UF. The side frame SF may be disposed between the upper frame UF and the lower frame DF. The side frame SF extend from the lower frame DF and the upper frame UF to connect the lower frame DF to the upper frame UF. For example, the side frame SF may be extended in a third direction DR3 (e.g., a normal direction), which is orthogonal to the planes defined by the first direction DR1 and the second direction DR2. However, exemplary embodiments of the present inventive concepts are not limited to the structure shown in the embodiments of FIGS. 1-2, and the housing HS may be variously modified. For example, the lower frame DF, side frame SF and upper frame UF of the housing HS may have a variety of different shapes.

The roller RM may be disposed in the housing HS. In an exemplary embodiment, the roller RM may have a circular or elliptical pillar shape extending in the second direction DR2. However, exemplary embodiments of the present inventive concepts are not limited thereto. The roller RM may rotate in a clockwise or counterclockwise direction about a rotating axis extending in the second direction DR2. Although FIG. 1 illustrates an example, in which one roller RM is disposed within the housing HS, exemplary embodiments of the present inventive concepts are not limited thereto and a plurality of rollers may be disposed within the housing HS in other exemplary embodiments.

An end portion of the display module DM may be attached to the roller RM. The display module DM may be wound on the roller RM as the roller RM rotates in the clockwise or counterclockwise direction. In an exemplary embodiment, the end portion of the display module DM may be attached to the display module DM by a pressure-sensitive adhesive. However, exemplary embodiments of the present inventive concepts are not limited thereto.

FIGS. 3 to 6 are cross-sectional views taken along line I-I' of FIG. 1 illustrating display modules DM, DM-a, DM-b, and DM-c according to exemplary embodiments of the present inventive concepts.

Figure 3:
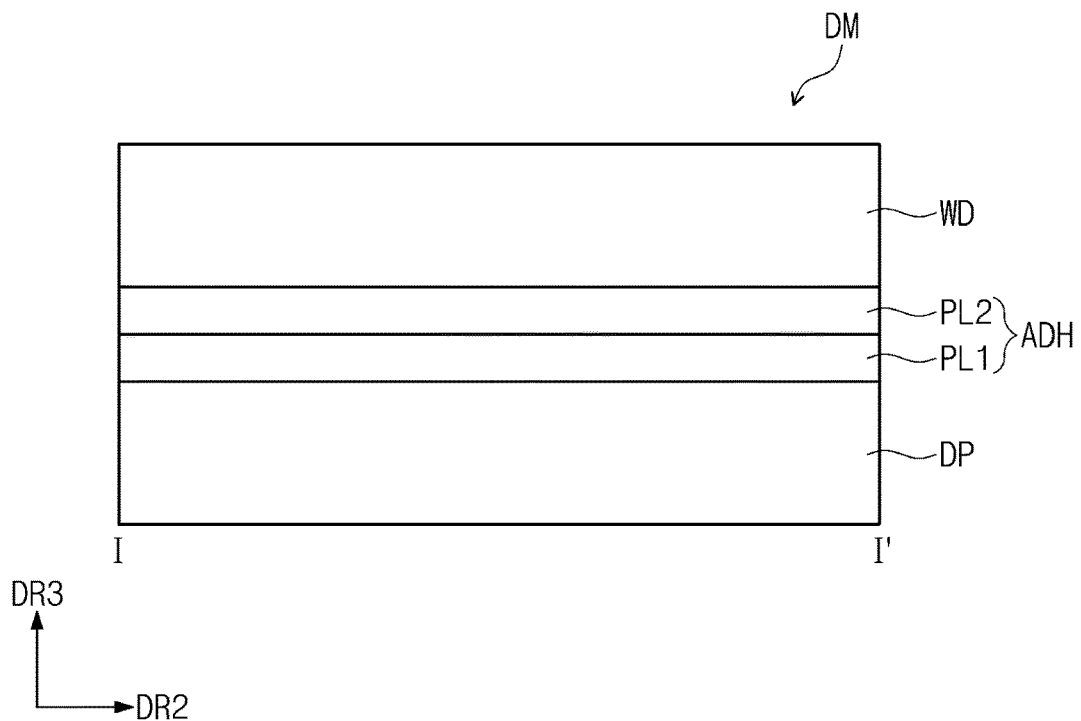
FIGS. 3 to 6 are cross-sectional views taken along line I-I' of FIG. 1 illustrating display modules according to exemplary embodiments of the present inventive concepts.

Referring to FIG. 3, the display module DM may include a display panel DP, a window WD, and an adhesion layer ADH.

The display panel DP may provide an image. In an exemplary embodiment, the display panel DP may be a liquid crystal display panel, an organic light emitting display panel, a quantum dot light emitting display panel, an electrowetting display panel, etc. However, exemplary embodiments of the present inventive concepts are not limited thereto. For convenience of description, the display panel DP will be described herein as an organic light emitting display panel or a quantum dot light emitting display panel.

The window WD may be disposed on the display panel DP and may cover a front surface of the display panel DP. The window WD may provide an input surface to a user. In an exemplary embodiment, the window WD may have a thickness ranging from about 50 μm to about 300 μm. However, exemplary embodiments of the present inventive concepts are not limited thereto. The window WD may have a single- or multi-layered structure. In an exemplary embodiment, the window WD may be a plastic film, which contains at least one material selected from the group consisting of, for example, polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and combinations thereof. However, exemplary embodiments of the present inventive concepts are not limited thereto. For example, in another exemplary embodiment, the window WD may be provided in the form of a glass or sapphire substrate.

The window WD may include at least one of a touch screen film or an optical film. In an exemplary embodiment, the optical film may be a polarizing film, a diffusion film, a protection film, etc. However, exemplary embodiments of the present inventive concepts are not limited thereto. In addition, the window WD may further include a functional coating layer, such as an anti-fingerprint coating layer, an anti-reflection coating layer, etc.

The adhesion layer ADH may be disposed between the display panel DP and the window WD. The adhesion layer ADH may be directly disposed between the display panel DP and the window WD (e.g., in the third direction DR3).

The adhesion layer ADH may include a first polymer layer PL1 and a second polymer layer PL2. The first polymer layer PL1 may have a positive charge or a partial positive charge. For example, the first polymer layer PL1 may be a cation polymer layer, which has positive charges throughout the first polymer layer PL1 or has partial positive charges. In an exemplary embodiment, the first polymer layer PL1 may be a cation polymer, which is obtained by polymerizing at least one selected from monomers including a styrene group, a diene group, an acrylate group, an aldehyde group, an epoxide group, an acrylonitrile group, or a cyanoacryl group. However, exemplary embodiments of the present inventive concepts are not limited thereto. For example, in another exemplary embodiment, the first polymer layer PL1 may include at least one of polyethyleneimide or cationic polyacrylamide. The first polymer layer PL1 may be disposed adjacent to the display panel DP or the window WD. The first polymer layer PL1 may be directly disposed on the display panel DP or the window WD. For example, in the exemplary embodiment shown in FIG. 3, a bottom surface of the first polymer layer PL1 of the adhesion layer ADH may directly contact a top surface of the display panel DP.

The second polymer layer PL2 may be directly disposed on the first polymer layer PL1 (e.g., in the third direction DR3). For example, in the exemplary embodiment shown in FIG. 3, a bottom surface of the second polymer layer PL2 may be disposed directly on a top surface of the first polymer layer PL1. A top surface of the second polymer layer PL2 of the adhesion layer ADH may be disposed directly on a bottom surface of the window WD. The second polymer layer PL2 may have a negative charge or a partial negative charge. In other words, the second polymer layer PL2 may be an anion polymer layer, which has negative charges throughout the second polymer layer PL2 or has partial negative charges. However, exemplary embodiments of the present inventive concepts are not limited to these examples. In an exemplary embodiment, the second polymer layer PL2 may be an anion polymer, which is obtained by polymerizing at least one selected from monomers including an isobutylene group, a styrene group, a diene group, or a vinylalkylether. For example, the second polymer layer PL2 may include at least one of anionic polyacrylamide, polyacryl acid, or polymethylacryl acid. The first polymer layer PL1 and the second polymer layer PL2, which have opposite electric charges, may be attached to each other by an electrostatic force.

FIG. 3 illustrates an example, in which the first and second polymer layers PL1 and PL2 are respectively disposed on a top surface of the display panel DP and a bottom surface of the window WD. However, exemplary embodiments of the present inventive concepts are not limited thereto. For example, in another exemplary embodiment, the first polymer layer PL1 may be disposed on a bottom surface of the display panel DP, and the second polymer layer PL2 may be disposed on a top surface of the window WD.

In an exemplary embodiment, each of the first and second polymer layers PL1 and PL2 may be provided on an element (e.g., the window WD or display panel DP) through a dip coating method, a slit coating method, etc.

Figure 4:
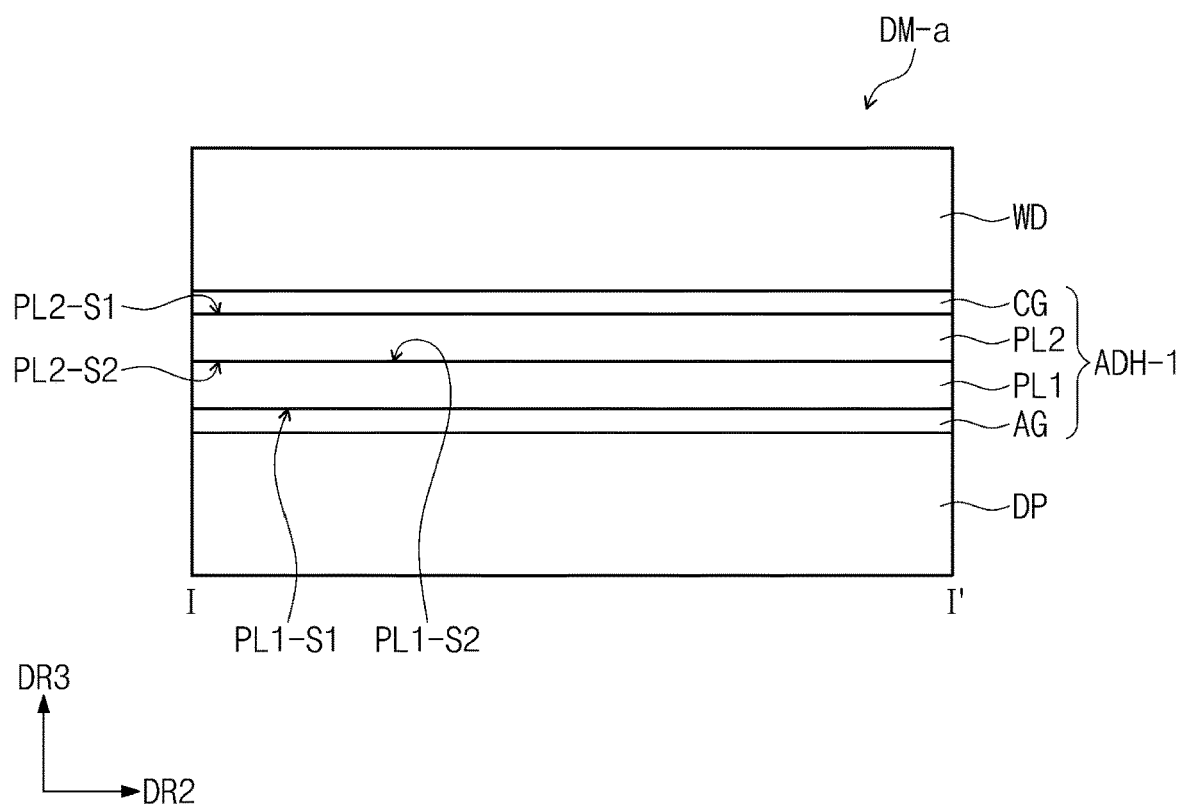

Referring to the exemplary embodiment shown in FIG. 4, the display module DM-a has an adhesion layer ADH-1 that includes an anion layer AG and a cation layer CG. The anion layer AG may be directly disposed on the first polymer layer PL1 and may be spaced apart from the second polymer layer PL2. The cation layer CG may be directly disposed on the second polymer layer PL2 and may be spaced apart from the first polymer layer PL1. For example, as shown in the exemplary embodiment of FIG. 4, a bottom surface of the anion layer AG may be disposed directly on a top surface of the display panel DP. A top surface of the anion layer AG may be disposed directly on a bottom surface PL1-S1 of the first polymer layer PL1. A bottom surface PL2-S2 of the second polymer layer PL2 may be disposed directly on a top surface PL1-S2 of the first polymer layer PL1. A bottom surface of the cation layer CG may be disposed directly on a top surface PLS2-S1 of the second polymer layer PL2. A bottom surface of the window WD may be disposed directly on a top surface of the cation layer CG.

While the exemplary embodiment of FIG. 4 shows the adhesion layer ADM-1 having a stacking structure, in which the anion layer AG, the first polymer layer PL1, the second polymer layer PL2, and the cation layer CG are sequentially stacked (e.g., in the third direction DR3), in other exemplary embodiments, the cation layer CG may be directly disposed on the display panel DP, and the anion layer AG may be directly disposed under the window WD.

The anion layer AG may include at least one anion selected from $OH^-$, $O^-$ or $O_2^-$. The cation layer CG may include at least one cation selected from $F^+$, $O^+$, $O_2^+$, $H^+$, $Ar^+$, or $N_2^+$. In an exemplary embodiment, the anion layer AG and the cation layer CG may be formed by a plasma treatment process or the like. For example, $OH^-$, $O^-$, $O_2^-$, $O^+$, and $O_2^+$ may be formed by an oxygen plasma treatment, an ultraviolet light ozone treatment process, or the like. F+ may be formed by a perfluoropolyether (PFPE) deposition process or a fluorine plasma treatment process. $H^+$, $Ar^+$, or $N_2^+$ may be formed by performing a plasma treatment process on hydrogen, argon, and nitrogen gases, respectively.

The anion layer AG having negative charges and the first polymer layer PL1 having a positive charge or a partial positive charge, have opposite electric charges to each other. Therefore, the anion layer AG and the first polymer layer PL1 may be attached to each other by an electrostatic force. In an exemplary embodiment, an adhesion strength between the anion layer AG and the first polymer layer PL1 due to the electrostatic force may be stronger than an adhesion strength between the display panel DP and the first polymer layer PL1. In exemplary embodiments in which the anion layer AG is disposed directly on the window WD, the adhesion strength between the anion layer AG and the first polymer layer PL1 may be stronger than an adhesion strength between the window WD and the first polymer layer PL1. Therefore, in embodiments in which the first polymer layer PL1 is disposed on the display panel DP or the window WD with the anion layer AG interposed therebetween, the first polymer layer PL1 may be more securely fastened to the display panel DP or the window WD than an embodiment in which the first polymer layer PL1 is directly disposed on the display panel DP or the window WD.

The cation layer CG having positive charges and the second polymer layer PL2 having a negative charge or a partial negative charge, have opposite electric charges to each other. Therefore, the cation layer CG and the second polymer layer PL2 may be attached to each other by an electrostatic force. An adhesion strength between the cation layer CG and the second polymer layer PL2 may be stronger than an adhesion strength between the window WD and the second polymer layer PL2. In exemplary embodiments in which the cation layer CG is disposed directly on the display panel DP, the adhesion strength between the cation layer CG and the second polymer layer PL2 may be stronger than an adhesion strength between the display panel DP and the second polymer layer PL2. Therefore, in embodiments in which the second polymer layer PL2 is disposed on the display panel DP or the window WD with the cation layer CG interposed therebetween, the second polymer layer PL2 may be more securely fastened to the display panel DP or the window WD than an embodiment in which the second polymer layer PL2 is directly disposed on the display panel DP or the window WD.

Figure 5:
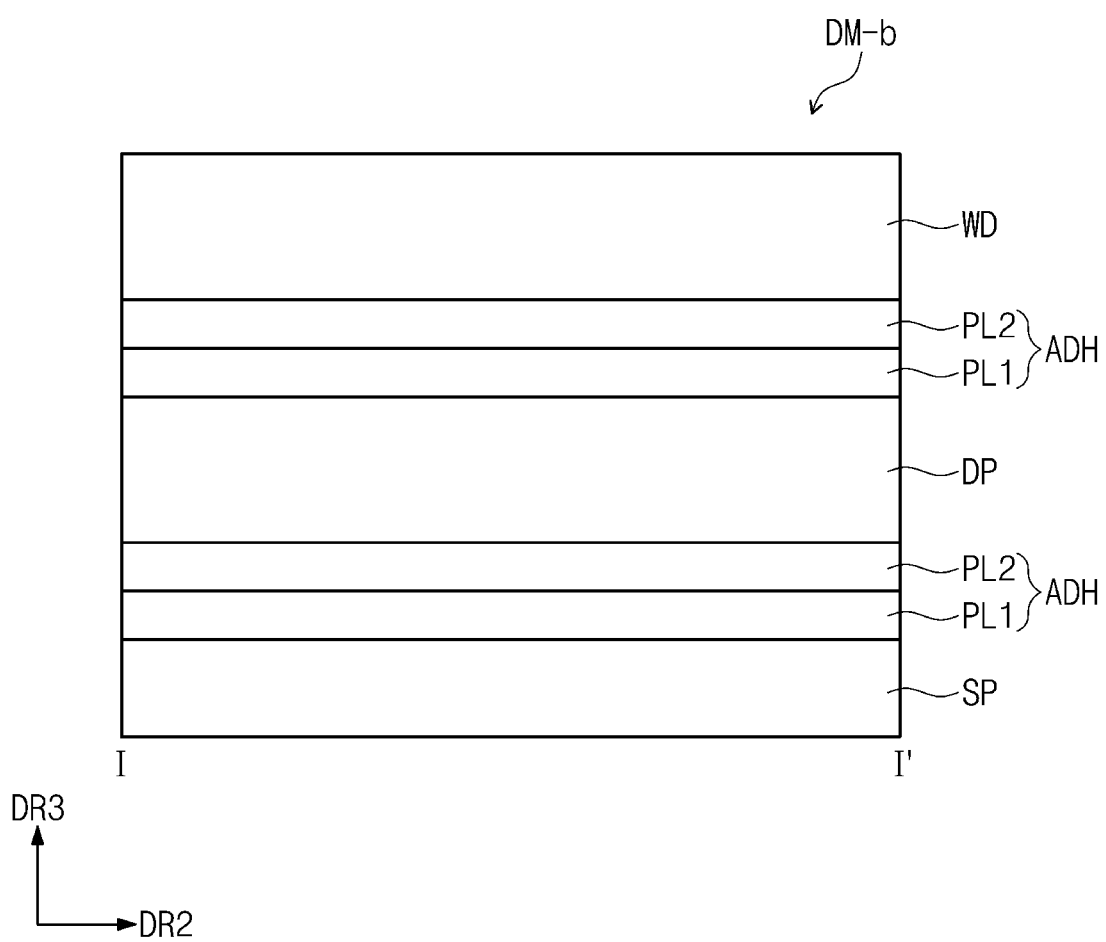
Figure 6:
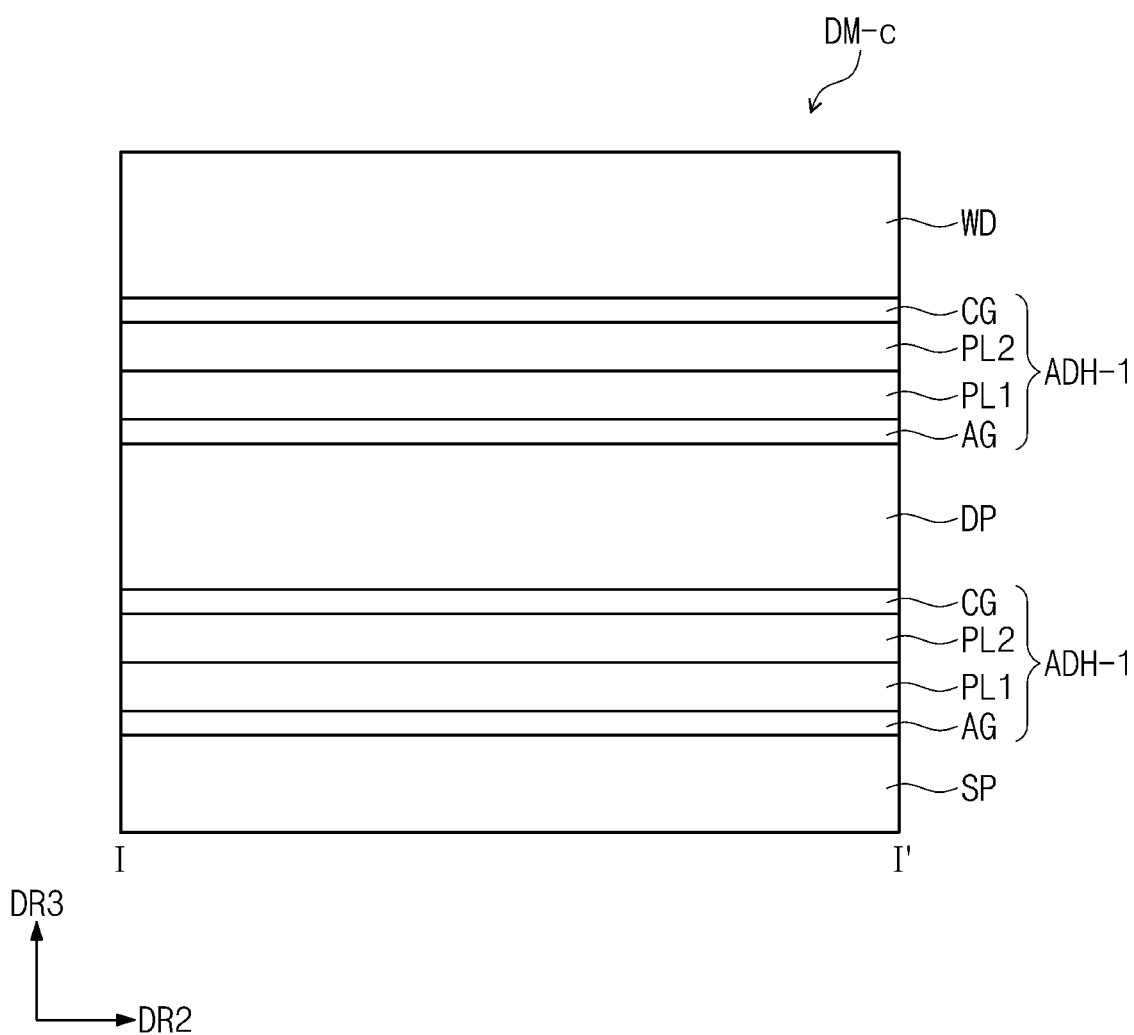

Referring to FIGS. 5 and 6, the display modules DM-b, DM-c may further include a supporting substrate SP. The supporting substrate SP may be disposed below the display panel DP to support or protect the display panel DP. For example, as shown in the exemplary embodiment of FIG. 5, the display module DM-b may include a top surface of the supporting substrate SP directly disposed on a bottom surface of the first polymer layer PL1. However, in another exemplary embodiment, the supporting substrate SP may be directly dispersed on the second polymer layer PL2. As shown in the exemplary embodiment of FIG. 6, the display module DM-c may include a top surface of the supporting substrate SP disposed directly on a bottom surface of the anion layer AG. However, in other exemplary embodiments, the supporting substrate SP may be disposed directly on a cation layer CG. In an exemplary embodiment, the supporting substrate SP may be a plastic film, which contains at least one compound selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC). poly(arylene ethersulfone), and combinations thereof. However, exemplary embodiments of the present inventive concepts are not limited thereto. For example, in another exemplary embodiment, the supporting substrate SP may be provided in the form of a metal film. The supporting substrate SP may include an optical film (e.g., a polarizing film, a diffusion film, a protection film, etc.).

The adhesion layer ADH or ADH-1 may be disposed in at least one of the regions which are disposed between the display panel DP and the window WD and between the supporting substrate SP and the display panel DP. For example, as shown in the exemplary embodiments of FIGS. 5-6, the adhesion layers ADH and ADH-1 are disposed in the area between the supporting substrate SP and display panel DP and in the area between the window WD and the display panel DP. In embodiments in which the adhesion layer ADH or ADH-1 is not disposed in one of the regions between the display panel DP and the window WD and between the supporting substrate SP and the display panel DP, a pressure-sensitive adhesive may be disposed therebetween. For example, the adhesion layer ADH or ADH-1. which is disposed between the display panel DP and the window WD, and the adhesion layer ADH or ADH-1, which is disposed between the supporting substrate SP and the display panel DP, may be replaced with the pressure-sensitive adhesive.

In an exemplary embodiment, except for the positioning of the adhesion layer ADH or ADH-1 between the supporting substrate SP and the display panel DP, the adhesion layer ADH or ADH-1 may be configured to have substantially the same features as the adhesion layer ADH or ADH-1 disposed between the display panel DP and the window WD. described with reference to FIGS. 3 and 4. Therefore, for the sake of brevity, the elements and features that are similar to those previously shown and described will not be repeated.

FIGS. 7, 8, 9A, 10A, and 10B are cross-sectional views taken along line II-II' of FIG. 1 illustrate a display device DD, DD-a, DD-b, DD-c, DD-d, or DD-e according to exemplary embodiments of the present inventive concepts.

Figure 9A:
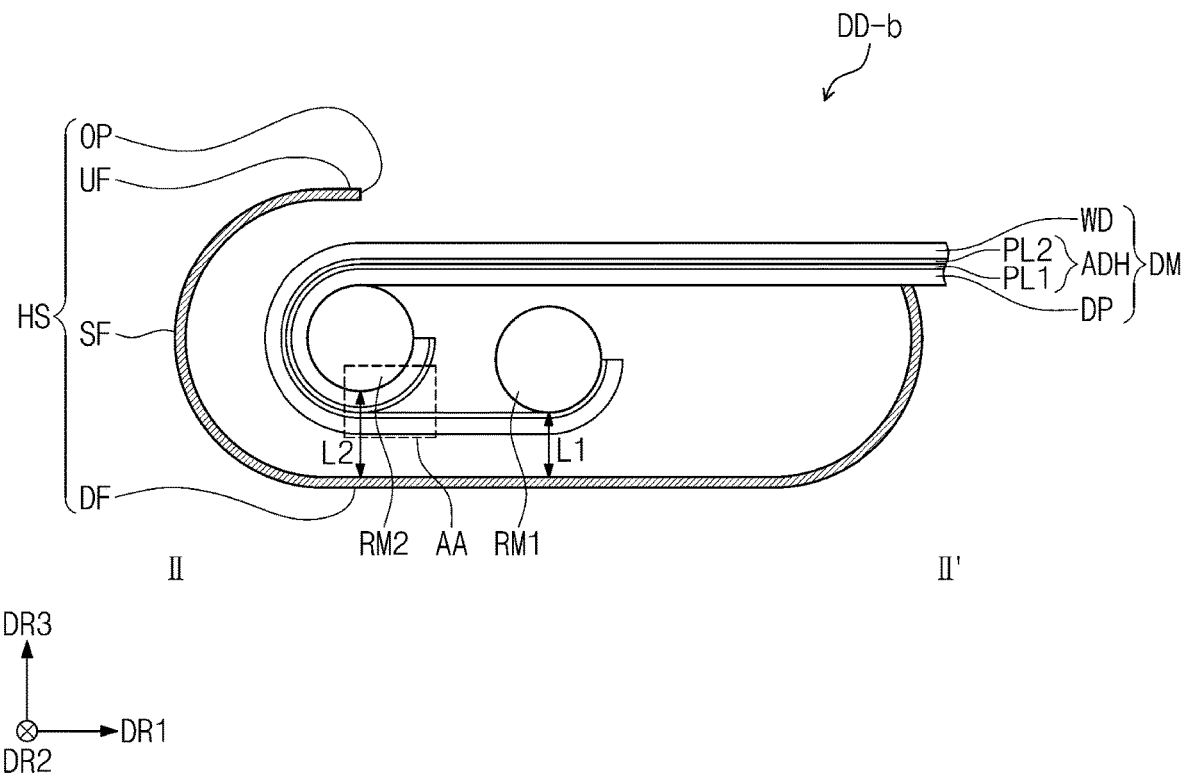
Figure 9B:
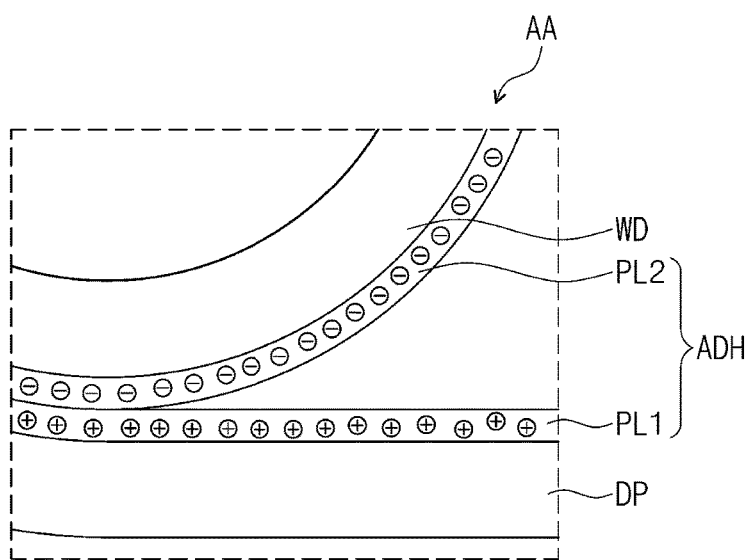
FIG. 9B is an enlarged view of portion AA of FIG. 9A according to an exemplary embodiment of the present inventive concepts.

FIG. 9B is an enlarged view of portion AA of FIG. 9A according to an exemplary embodiment of the present inventive concepts.

For concise description, an element of the display module DM, DM-a, DM-b, or DM-c, which has been described with reference to FIGS. 3 to 6, may be identified by the same reference number without repeating an overlapping description thereof. The exemplary embodiments of FIGS. 7, 8, 10A, and 10B include a display module DM-b having the features described with reference to FIG. 5. However, in other exemplary embodiments, the display module included in the display device of FIGS. 7, 8, 10A and 10B have substantially the same features as those of the display module DM-c of FIG. 6. The exemplary embodiments of FIGS. 9A and 9B include a display module DM having the features described with reference to FIG. 3. However, in other exemplary embodiments, the display device of FIGS. 9A and 9B may include a display module having substantially the same features as those of the display module DM-a of FIG. 4.

Figure 7:
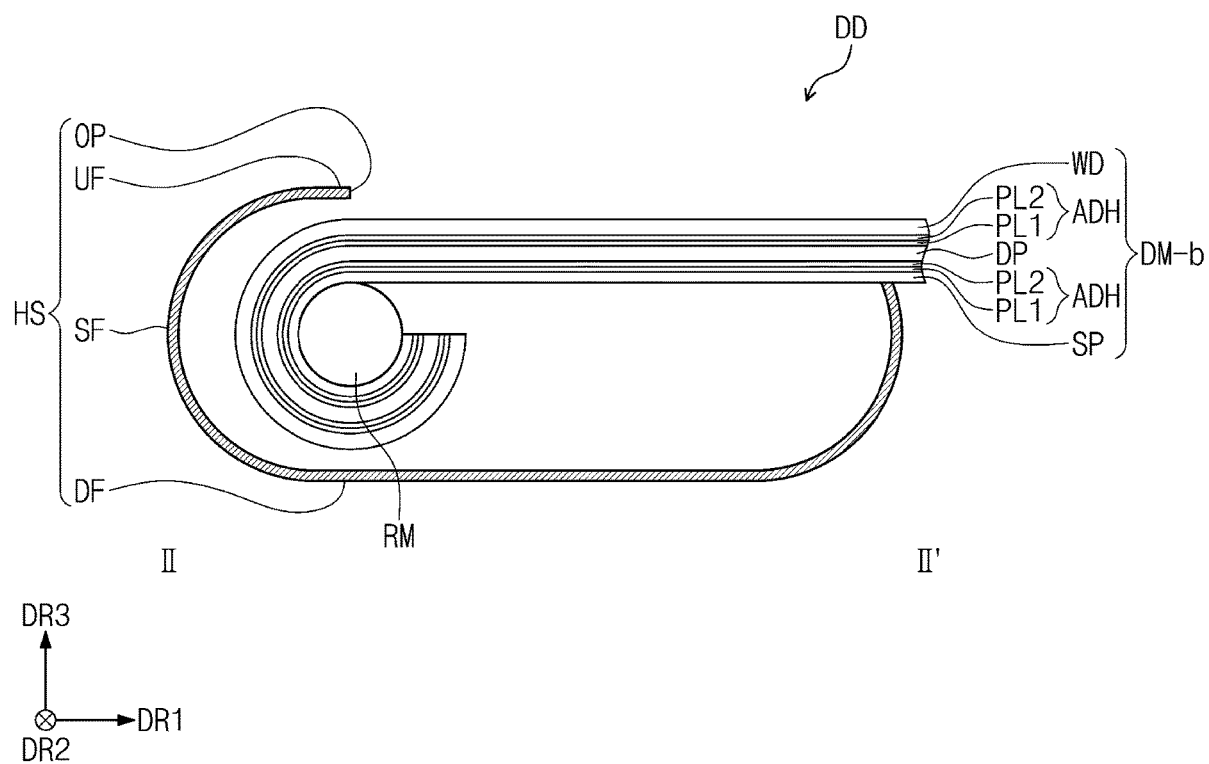
FIGS. 7, 8, 9A, 10A, and 10B are cross-sectional views taken along line II-II' illustrating display devices according to exemplary embodiments of the present inventive concepts.

FIG. 7 illustrates an exemplary embodiment, in which one roller RM is disposed in the housing HS.

An end portion of the display module DM-b may be attached to or detached from the roller RM as the roller RM rotates. In an exemplary embodiment, a pressure-sensitive adhesive may be disposed on a rear surface of an end portion of the supporting substrate SP, and the display module DM-b may be attached to or detached from the roller RM as the roller RM rotates.

Referring to FIG. 1, the display module DM-b may be drawn from the housing HS by rotating the roller RM in a clockwise direction. The display module DM-b may be inserted in the housing HS by rotating the roller RM in a counterclockwise direction. However, exemplary embodiments of the present the inventive concepts are not limited thereto. For example, in another exemplary embodiment, the structure of the roller RM and the display module DM-b may be configured so that the rotation of the roller RM clockwise results in the insertion of the display module DM-b in the housing HS and the rotation of the roller RM counterclockwise results in the drawing of the display module DM-b from the housing HS.

In an exemplary embodiment in which the supporting substrate SP is omitted, a pressure-sensitive adhesive may be disposed on the bottom surface (e.g., the rear surface) of the display panel DP, and thus, the display module DM-b may be attached to or detached from the roller RM.

In a conventional structure, a pressure-sensitive adhesive is disposed in both of the regions between the display panel DP and the window WD and between the supporting substrate SP and the display panel DP to adhere the elements of a display module. However, the display panel DP, the window WD, and the supporting substrate SP may be wound on a roller with different curvatures. Therefore, when the display module is wound or unwound, a stress may be applied to the display module. Accordingly, the pressure-sensitive adhesive may be separated from the display panel DP, the window WD, and the supporting substrate SP due to the stress applied to the display module. Further, the display panel DP. the window WD, and the supporting substrate SP may be easily cracked due to the stress applied to the display module when the display module is wound or unwound.

According to an exemplary embodiment of the present inventive concepts, the display device DD may include the adhesion layer ADH, which is disposed in at least one of the regions between the display panel DP and the window WD and between the supporting substrate SP and the display panel DP.

In the adhesion layer ADH, the first polymer layer PL1 with positive charges and the second polymer layer PL2 with negative charges may be attached to each other by an electrostatic force. Therefore, in instances in which the display module DM-b is wound or unwound and is applied with a stress, the first and second polymer layers PL1 and PL2, which are attached to each other by the electrostatic force, may be finely moved through a sliding with respect to each other, without separation therebetween. In this exemplary embodiment in which the first and second polymer layers PL1 and PL2 are configured to finely move through the sliding with respect to each other, the stress applied to the display module DM-b may be absorbed. Therefore, the separation of the adhesion layer ADH from the display panel DP, the window WD, and the supporting substrate SP or the cracking of the display panel DP, the window WD, and the supporting substrate SP may be prevented to improve the operational reliability of the display device DD.

Figure 8:
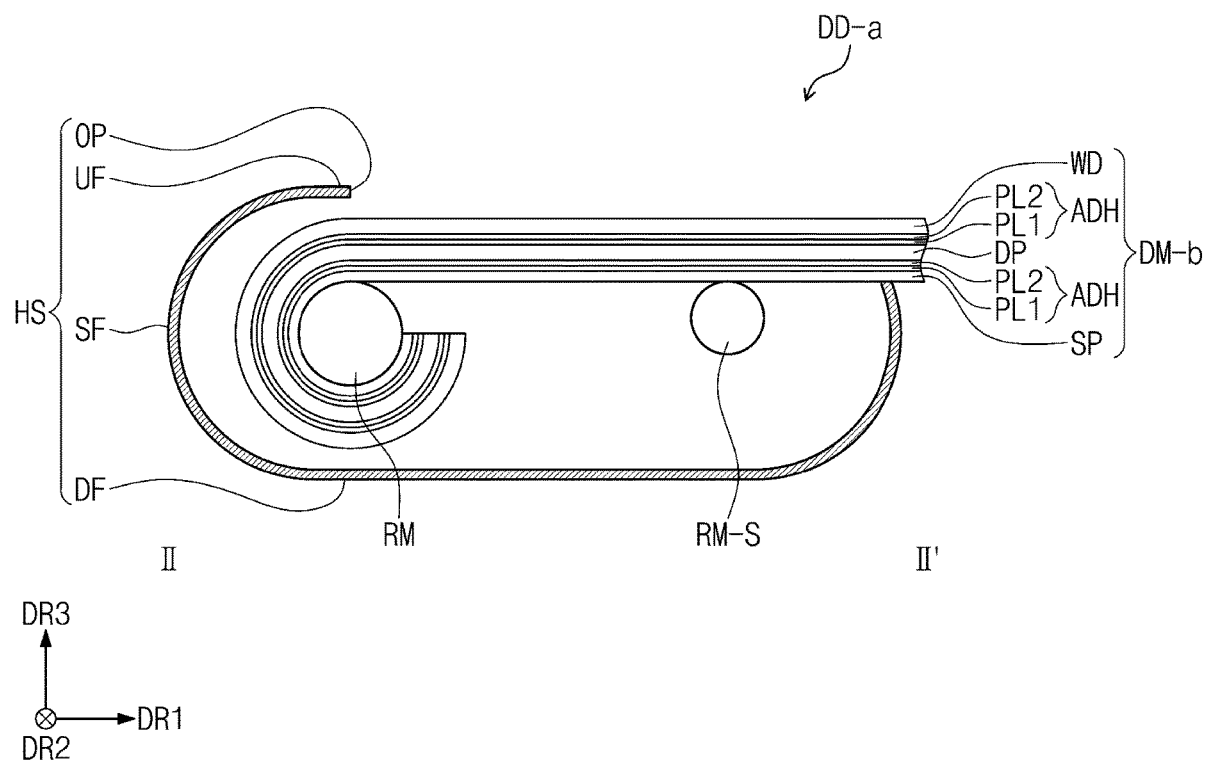

Referring to FIG. 8, the display device DD-a according to an exemplary embodiment of the present inventive concepts may further include at least one supplementary roller RM-S. The supplementary roller RM-S may be spaced apart from the roller RM to guide the display module DM-b. For example, as shown in the exemplary embodiment of FIG. 8, the supplementary roller RM-S may be spaced apart from the roller RM in the first direction DR1 to support the display module DM-b. For example, the display module DM-b may not wind on the supplementary roller RM-S. However, the supplementary roller RM-S may press or support the display module DM-b before a winding step. Therefore, the supplementary roller RM-S may help prevent the first and second polymer layers PL1 and PL2 from being detached or separated from each other. In addition, the supplementary roller RM-S may prevent the adhesion layer ADH front being separated from the window WD, the display panel DP, and the supporting substrate SP.

In the exemplary embodiment shown in FIG. 8, the supplementary roller RM-S includes only a single supplementary roller. However, in other exemplary embodiments of the present inventive concepts, the display device may include two or more supplementary rollers RM-S to press or support the display module.

As shown in the exemplary embodiment of FIG 9A, the display device DD-b may include a first roller RM1 and a second roller RM2. The window WD may be adhered or attached to the first roller RM1. For example, as shown in the exemplary embodiment of FIG. 9A, a first surface of the second polymer layer PL2 may be attached to or adhered to the first roller RM1 and a second surface of the second polymer layer PL2 that opposes the fast surface may be attached to an end of the window WD. An end of the display panel DP may be adhered or attached to the second roller RM2. For example, as shown in the exemplary embodiment of FIG. 9A, a first surface of the display panel DP may be attached to or adhered to the second roller RM2 and a second surface of the display panel DP that opposes the first surface may be attached to a first surface of the first polymer layer PL1. A second surface of the first polymer layer PL1 that opposes the first surface may directly contact a first surface of the second polymer layer PL2. The first roller RM1 may wind the window WD, and the second roller RM2 may wind the display panel DP. The other elements of the display device DD-b of FIG. 9A that correspond to lire display device DD described with reference to FIG. 7, may be configured to have substantially the same features as such elements in FIG. 7.

The first roller RM1 and the second roller RM2 may be spaced apart from each other. For example, as shown in the exemplary embodiment of FIG. 9A, the first roller RM1 may be spaced apart fawn the second roller RM2 in the first direction DR1. The second roller RM2 may also be higher than tire first roller RM1. For example, a distance L1 between the first roller RM1 and the lower frame DF (e.g., in the third direction DR3) may be smaller than a distance L2 between the second roller RM2 and the lower frame DF (e.g., in the third direction DR3). In the present exemplary embodiment, the distance between the roller and the frame may refer to a shortest distance between the roller and the frame.

The second roller RM2 may overlap with at least a portion of the upper frame UF (e.g., in the third direction DR3). In an exemplary embodiment, the first roller RM1 may overlap with the opening OP or at least a portion of the upper frame UF (e.g., in the third direction DR3). In exemplary embodiments in which the second roller RM2 that winds the display panel DP overlaps with at least a portion of the upper frame UF and the first roller RM1 is spaced apart from the second roller RM2 in the first direction DR1, an image may be displayed through the opening OP defined in the housing HS, even when the housing HS is elongated in the first direction DR1. Thus, the display device may provide a relatively large display surface for a given space and may efficiently exploit the space.

The window WD and the display panel DP may be attached to or detached from each other as the first roller RM1 and the second roller RM2 rotate. For example, in an exemplary embodiment when the first roller RM1 and the second roller RM2 rotate in a clockwise direction, the display module DM may be drawn from an internal space of the housing HS (e.g., may extend outwardly from the housing in the first direction DR1). The first and second polymer layers PL1 and PL2 may be adhered to each other as the display module DM is drawn, and thus, the display panel DP and the window WD may be coupled to each other to form a single object. In an exemplary embodiment when the first roller RM1 and the second roller RM2 rotate in a counterclockwise direction, the display module DM may be inserted into the internal space of the housing HS and the first and second polymer layers PL1 and PL2 may be separated from each other. Therefore, the display panel DP and the window WD may be spaced apart from each other. However, exemplary embodiments of the present inventive concepts are not limited thereto, and the rollers RM1 and RM2 and the display module DM may be disposed in such a way that rotation directions of the rollers RM1 and RM2 for inserting or drawing the display module DM may be variously modified.

FIG. 9B is an enlarged sectional view of a portion 'AA' of FIG. 9A. Referring to FIG. 9B, when the first roller RM1 and the second roller RM2 rotate in a clockwise direction, the first and second polymer layers PL1 and PL2 may be in contact with each other, and in this case, since the first and second polymer layers PL1 and PL2 have opposite electric charges, they may be attached to each other by an electrostatic force. In contrast, w hen the first roller RM1 and the second roller RM2 rotate in a counterclockwise direction, a force, which is stronger than the electrostatic force, may be exerted between the first and second polymer layers PL1 and PL2, and thus, the first and second polymer layers PL1 and PL2 may be separated from each other.

In an exemplary embodiment in which both of the window WD and the display panel DP are wound on the same roller RM, a curvature radius of the window WD, which is adjacent to an outer surface that is exposed as a top surface, may be greater than a curvature radius of the display panel DP, which is adjacent to an inner surface that is wound as an inner surface. Therefore, the curvature radius of the window WD may be greater than the curvature radius of the display panel DP. In an embodiment in which two members, such as the window WD and the display panel DP, with two different curvature radii are wound on one roller RM, the display module DM-b may be easily cracked by a stress exerted thereon. In contrast, according to an exemplary embodiment of the present inventive concepts, the display module DM-b may be wound on two different rollers RM1 and RM2 which results in a reduction of the stress as compared with embodiments in which the window WD and the display panel DP are wound on one roller. Accordingly, it may be possible to prevent the cracking of the display module DM and to improve the operational reliability of the display device DD-b.

In an exemplary embodiment, the first and second polymer layers PL1 and PL2 of the adhesion layer ADH may not exhibit an adhesion property to an uncharged particle. Therefore, even if the first and second polymer layers PL1 and PL2 of the adhesion layer ADH are exposed to a contamination material (e.g., dust), in the insertion and drawing steps, it may be possible to suppress the inflow of the contamination material as compared with the conventional pressure-sensitive adhesive. In addition, when the display module DM is wound or unwound, the stress applied to the display module may be absorbed through the sliding of the first and second polymer layers PL1 and PL2. Therefore, the operational reliability of the display device DD is improved.

The display module DM according to an exemplary embodiment of the present inventive concepts may further include the supporting substrate SP (e.g., see FIG. 5). In an exemplary embodiment, the supporting substrate SP may be attached or adhered to the adhesion layer ADH, which is disposed on the rear surface of the display panel DP, and may be wound by the second roller RM2.

Figure 10A:
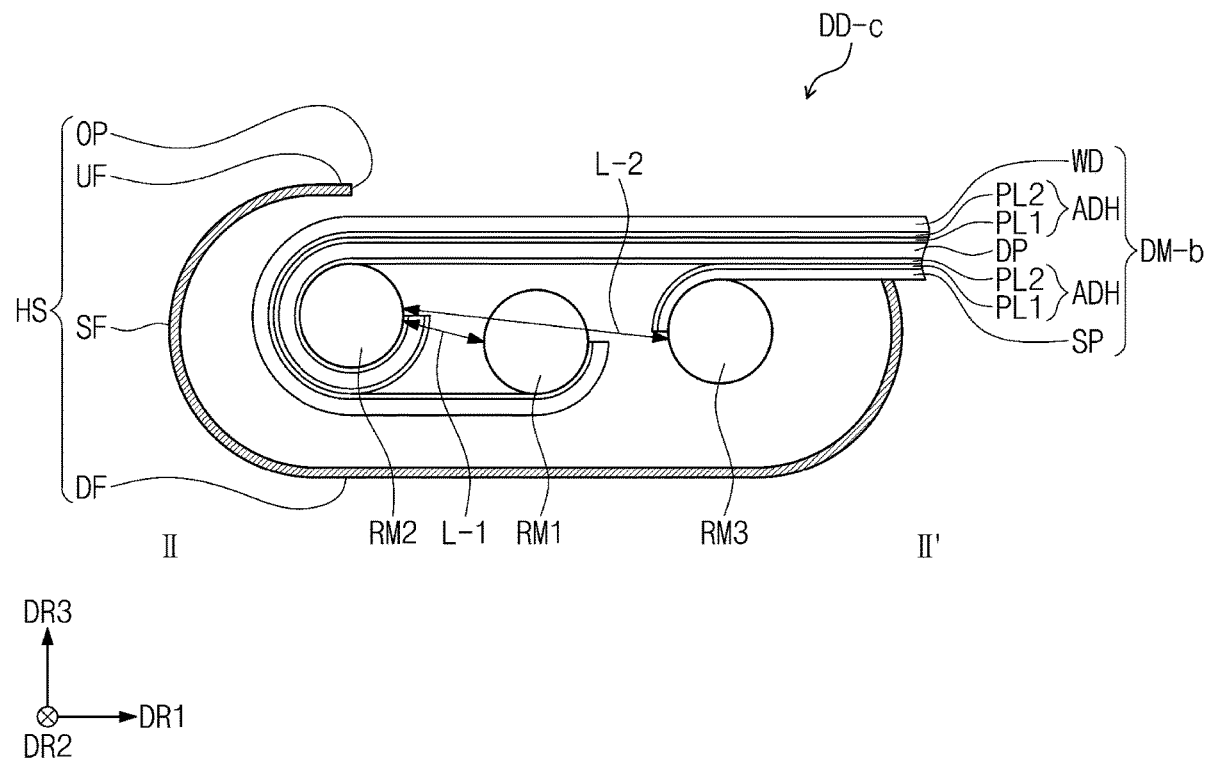
Figure 10B:
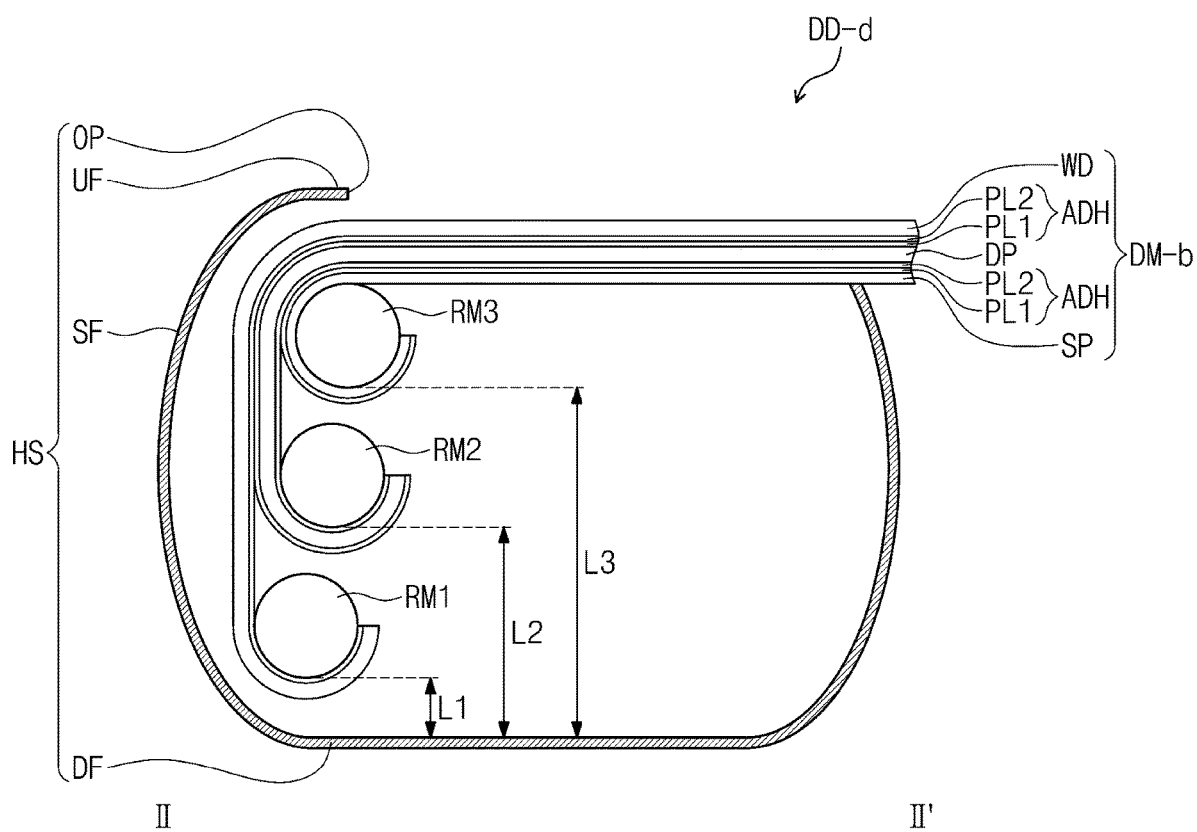

As shown in the exemplary embodiments of FIGS. 10A and 10B, the display device DD-c or DD-d may include the first roller RM1, the second roller RM2, and a third roller RM3. In the display device DD-c or DD-d shown in FIGS. 10A and 10B, an element, which corresponds to the display device DD or DD-b described with reference to FIGS. 7, 9A, or 9B, may be configured to have substantially the same features as such elements in FIGS. 7, 9A, or 9B.

Referring to FIG. 10A. an end portion of the window WD may be attached or adhered to the first roller RM1. For example, as shown in the exemplary embodiment of FIG. 10A, a first surface of the second polymer layer PL2 of the adhesion layer ADH disposed between the window WD and the display panel DP may be attached or adhered to the first roller RM1 and a second surface of the second polymer layer PL2 that opposes the first surface may be attached to an end portion of the window WD.

An end portion of the display panel DP may be attached or adhered to the second roller RM2. For example, as shown in the exemplary embodiment of FIG. 10A, a first surface of the second polymer layer PL2 of the adhesion layer ADH disposed between the display panel DP and the supporting substrate SP may be attached to or adhered to the second roller RM2 and a second surface of the second polymer layer PL2 that opposes the first surface may be attached to an end of a rear surface of the display panel DP. A front surface of the display panel DP may be attached or adhered to a first surface of the first polymer layer PL1 of the adhesion layer ADH disposed between the window WD and rive display panel DP. A second surface of the first polymer layer PL1 of the adhesion layer ADH disposed between the window WD and the display panel DP may directly contact the first surface of the second polymer layer PL2 of such adhesion layer.

An end portion of the supporting substrate SP may be attached or adhered to the third roller RM3. For example, as shown in the exemplary embodiment shown in FIG. 10A, an end of a rear surface of the supporting substrate SP may be attached or adhered to the third roller RM3. A front surface of the supporting substrate SP may be attached or adhered to a first surface of the first polymer layer PL1 of tire adhesion layer ADH between the display panel DP and the supporting substrate SP. A second surface of the first polymer layer PL1 may directly contact the first surface of the second polymer layer PL2 of such adhesion layer ADH.

The first roller RM1 may wind the end portion of the window WD, the second roller RM2 may wind the end portion of the display panel DP, and the third roller RM3 may wind the end portion of the supporting substrate SP.

As shown in the exemplary embodiment of FIG. 10A, the first roller RM1, the second roller RM2, and the third roller RM3 may be spaced apart from each other (e.g., in the first direction DR1). In an exemplary embodiment, the first roller RM1 may be disposed between the second roller RM2 and the third roller RM3. A distance between the first roller RM1 and the second roller RM2 may be larger than a distance between the first roller RM1 and the third roller RM3. In the present specification, the distance between the rollers may mean the shortest distance between the rollers.

A distance L-1 between the first roller RM1 and the second roller RM2 may be smaller than a distance L-2 between the second roller RM2 and the third roller RM3. The first roller RM1, and the third roller RM3 may be overlapped with the opening OP (e.g., in the third direction DR3), and at least a portion of the second roller RM2 may be overlapped with the upper frame UF (e.g., in the third direction DR3). In this exemplary embodiment, even if the housing HS is elongated in the first direction, an image may be displayed through the opening OP defined in the housing HS. Thus, the display device may provide a relatively large display surface for a given space and may efficiently exploit the space.

However, exemplary embodiments of the present inventive concepts are not limited thereto. For example, as shown in FIG. 10B, the first to third rollers RM1, RM2, and RM3 may be spaced apart from the lower frame DF in a thickness direction of the display module DM-b (e.g., in the third direction DR3) and each of the first to third rollers may be overlapped with at least a portion of the upper frame UF (e.g., in the third direction DR3). In an exemplary embodiment, the distance L1 between the first roller RM1 and the lower frame DF (e.g., in the third direction DR3) may be smaller than the distance L2 between the second roller RM2 and the lower frame DF (e.g., in the third direction DR3). The distance L2 between the second roller RM2 and the lower frame DF (e.g., in the third direction DR3) may be smaller than a distance L3 between the third roller RM3 and the lower frame DF (e.g., in the third direction DR3).

In addition to the window WD and the display panel DP, the display panel DP and the supporting substrate SP may be attached to or detached from each other by rotations of the first, second, and third rollers RM1, RM2, and RM3. For example, in an exemplary embodiment when the first, second, and third rollers RM1, RM2, and RM3 rotate in a clockwise direction, the display module DM-b may be drawn from an internal space of the housing HS. As the display module DM-b is drawn from the internal space of the housing, the first and second polymer layers PL1 and PL2 may be adhered to each other, and thus, the display panel DP, the window WD, and the supporting substrate SP may be coupled to each other to form a single object. In an exemplary embodiment, when the first, second, and third rollers RM1, RM2, and RM3 rotate in a counterclockwise direction, the display module DM-b may be inserted into the internal space of the housing HS. As the display module DM-b is inserted into the internal space of the housing HS, the first and second polymer layers PL1 and PL2 may be separated from each other, and thus, the display panel DP, the window WD, and the supporting substrate SP may be spaced apart from each other. However, exemplary embodiments of the present inventive concepts are not limited to thereto, and the arrangement of the window WD, the display panel DP, the supporting substrate SP, the first, second, and third rollers RM1, RM2, and RM3 may be modified so that rotation directions of the first, second, and third rollers RM1, RM2, and RM3 may be variously modified when the window WD, the display panel DP, and the supporting substrate SP are inserted or drawn. According to an exemplary embodiment of the present inventive concepts, since the window WD, the display panel DP, and the supporting substrate SP are wound on respective rollers RM1, RM2, and RM3, the stress may be reduced, compared with embodiments in which the window WD and the display panel DP are wound on a single roller. Therefore, the display device DD-c or DD-d may prevent the cracking of the display module DM-b and improves the operational reliability of the display device DD-c or DD-d. In addition, an inflow amount of a contamination material in the insertion and drawing steps of the display module DM-b may be reduced, and a stress, which may occur when the display module DM-b is wound or unwound, may be absorbed to improve the operational reliability of the display device DD-c or DD-d.

In an exemplary embodiment, each of the first to third rollers RM1, RM2, and RM3 may be connected to a driving part. In certain exemplary embodiments, one or two rollers, which are selected from the first to third rollers RM1, RM2, and RM3, may be connected to the driving part.

There may be a difference in rotation speed between the first to third rollers RM1, RM2, and RM3. In an exemplary embodiment in which the first to third rollers RM1, RM2, and RM3 are connected to respective driving parts, it is necessary to precisely control the driving parts, according to insertion and drawing speeds of the display module DM-b. For example, if there is an error in the rotation speeds of the first to third rollers RM1, RM2, and RM3, members attached to the first to third rollers RM1, RM2, and RM3 may be erroneously moved and may damage the display module DM-b. However, in an exemplary embodiment in which only one or two rollers of the first to third rollers RM1, RM2, and RM3 are connected to the driving part, it is sufficient to control only one or two driving parts, and this may allow for an easy design. For example, in an exemplary embodiment in which only the second roller RM2 is connected to the driving part, the first roller RM1 and the third roller RM3, which are attached to respective members of the display module DM-b, may be rotated by rotation of the second roller RM2, which receives a driving signal from the driving part. Therefore, the display module DM-b may prevent damage due to the difference in rotation speed between the first to third rollers RM1, RM2, and RM3.

Figure 11:
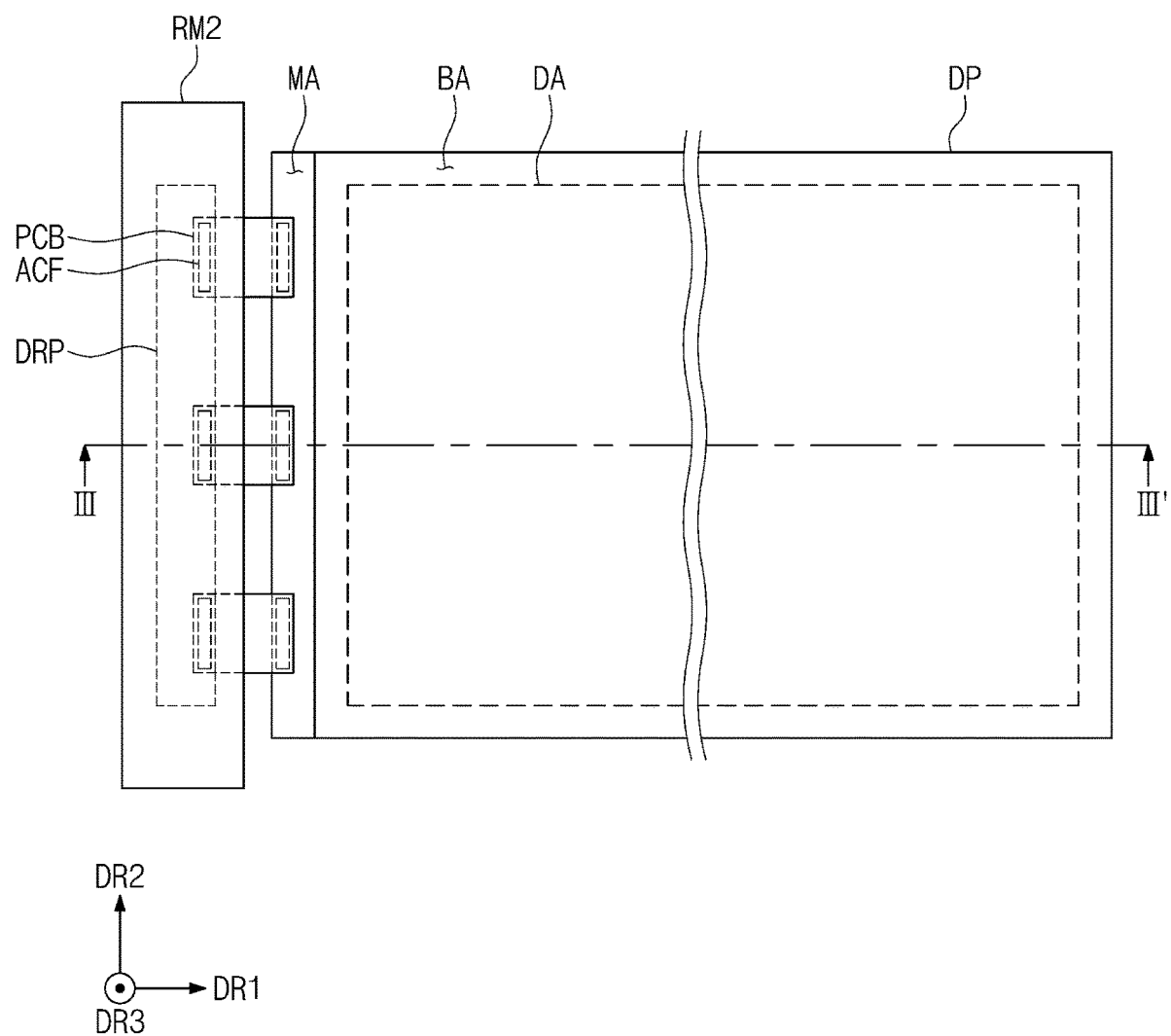
FIG. 11 is a top plan view illustrating a portion of a display device according to an exemplary embodiment of the present inventive concepts.
Figure 12A:
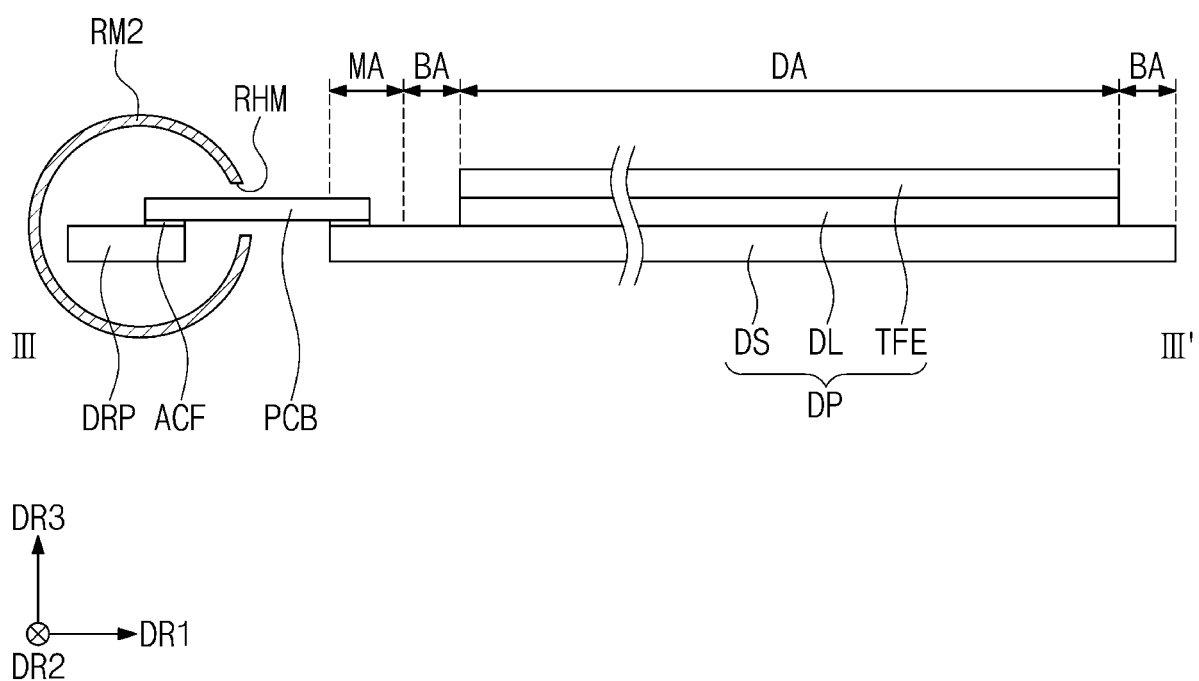
FIG. 12A is a cross-sectional view illustrating a portion of a display device, taken along line III-III' of FIG. 11 according to an exemplary embodiment of the present inventive concepts.
Figure 12B:
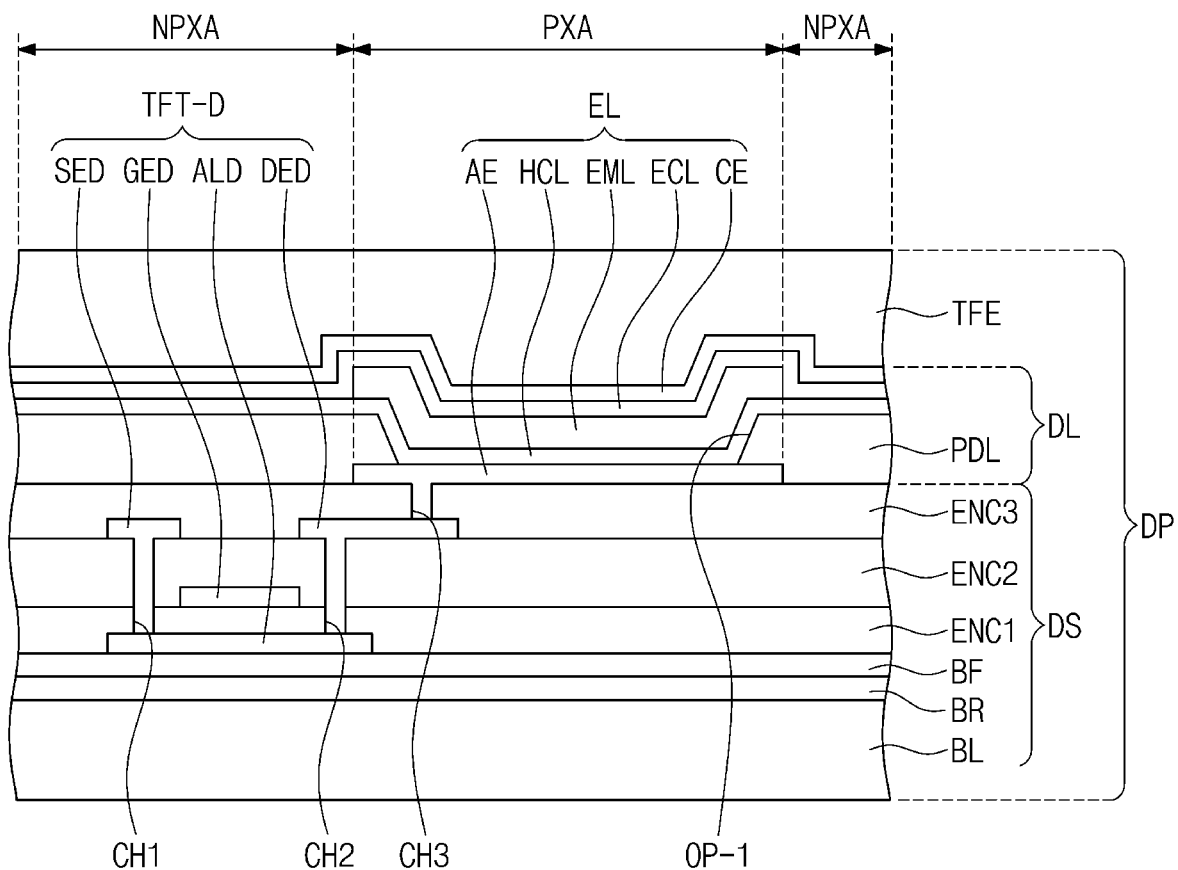
FIG. 12B is a cross-sectional view illustrating a portion of a display panel according to an exemplary embodiment of the present inventive concepts.

FIG. 11 is a top plan view illustrating a portion of the display device DD-c according to an exemplary embodiment of the present inventive concepts. FIG. 12A is a cross-sectional view taken along a line III-III' of FIG. 11 illustrating a portion of the display device DD-c. FIG. 12B is a cross-sectional view illustrating a portion of a display panel according to an exemplary embodiment of the present inventive concepts.

Referring to FIG. 11, the display panel DP may include a display region DA for displaying an image, a non-display region BA disposed adjacent to the display region DA (e.g., along the periphery of the display region DA) in which an image is not displayed, and a mounting region MA, to which a connection substrate PCB is coupled. In an exemplary embodiment, the non-display region BA and the mounting region MA may not be provided as distinct regions. For example, the non-display region BA may be omitted, or the mounting region MA may form a portion of the non-display region BA.

As shown in FIGS. 12A and 12B, the display panel DP may include a display substrate DS, an emission element layer DL disposed on the display substrate DS, and an encapsulation layer TFE disposed on the emission element layer DL (e.g., in the third direction DR3).

As shown in FIG. 12B, the display substrate DS may include a base layer BL, organic/inorganic layers BR, BF, ENC1, ENC2, and ENC3, a switching transistor, and a driving transistor TFT-D. A semiconductor pattern ALD of the driving transistor TFT-D may be disposed on the base layer BL. In an exemplary embodiment, the semiconductor pattern ALD may be formed of or include at least one of amorphous silicon, polysilicon, or metal oxide semiconductor materials.

The organic/inorganic layers BR, BF, ENC1, ENC2, and ENC3 may include functional layers BR and BF, a First insulating layer ENC1. a second insulating layer ENC2, and a third insulating layer ENC3.

The functional layers BR and BF may be disposed on a surface of the base layer BL. The functional layers BR and BF may include at least one of a barrier layer BR or a buffer layer BF. The semiconductor pattern ALD may be disposed on the barrier layer BR or the buffer layer BF.

The first insulating layer ENC1 may be disposed on the base layer BL to cover the semiconductor pattern ALD. The first insulating layer ENC1 may include an organic layer and/or an inorganic layer. In an exemplary embodiment, the first insulating layer ENC1 may include a plurality of inorganic thin films. The plurality of inorganic thin films may include a silicon nitride layer and a silicon oxide layer. However, exemplary embodiments of the present inventive concepts are not limited thereto.

A control electrode GED of the driving transistor TFT-D may be disposed on the first insulating layer ENC1. A control electrode of a switching transistor may also be disposed on the first insulating layer ENC1. The second insulating layer ENC2 may be disposed on the first insulating layer ENC1 to cover the control electrode GED. The second insulating layer ENC2 may include an organic layer and/or an inorganic layer. For example, in an exemplary embodiment, rite second insulating layer ENC2 may include a plurality of inorganic thin films. The plurality of inorganic thin films may include a silicon nitride layer and a silicon oxide layer. However, exemplary embodiments of the present inventive concepts are not limited thereto.

An input electrode SED and an output electrode DED of the driving transistor TFT-D may be disposed on the second insulating layer ENC2. In an exemplary embodiment, the input and output electrodes of the switching transistor may also be disposed on the second insulating layer ENC2.

The input electrode SED and the output electrode DED may be respectively connected to two different portions of the semiconductor pattern ALD through a first penetration hole CH1 and a second penetration hole CH2, which are formed to penetrate the first insulating layer ENC1 and the second insulating layer ENC2. The first penetration hole CH1 and second penetration hole CH2 and the respective positions of the semiconductor pattern ALD may be spaced apart (e.g., in the first direction DR1).

The third insulating layer ENC3 may be disposed on the second insulating layer ENC2 to cover the input electrode SED and the output electrode DED The third insulating layer ENC3 may include an organic layer and/or an inorganic layer. For example, in an exemplary embodiment, the third insulating layer ENC3 may include an organic material and may be formed to have a flat top surface.

However, exemplary embodiments of the present inventive concepts are not limited thereto and in an exemplary embodiment, at least one of the first insulating layer ENC1, the second insulating layer ENC2, and the third insulating layer ENC3 may be omitted, depending on the circuit structure of the pixel. Each of the second insulating layer ENC2 and the third insulating layer ENC3 may be defined as an interlayered insulating layer. The interlayered insulating layer may be used to electrically separate conductive patterns, which are disposed on and below the interlayered insulating layer or are spaced apart from each other with the interlayered insulating layer interposed therebetween.

The emission element layer DL may be disposed on the third insulating layer ENC3. The emission element layer DL may include a pixel definition layer PDL and an emission element EL. An anode AE may be disposed on the third insulating layer ENC3. The anode AE may be connected to the output electrode DED of the driving transistor TFT-D through a third penetration hole CH3, which is formed to penetrate the third insulating layer ENC3. The opening OP-1 may be defined in the pixel definition layer PDL. The opening OP-1 of the pixel definition layer PDL may expose a portion of the anode AE.

The emission element layer DL may include a light-emitting region PXA and a non-light-emitting region NPXA adjacent to the light-emitting region PXA. The non-light-emitting region NPXA may enclose the light-emitting region PXA. In the exemplary embodiment shown in FIG. 12B, the light-emitting region PXA is defined to correspond to the anode AE. However, the shape or position of the light-emitting region PXA is not limited thereto, and the light-emitting region PXA may have various shapes, provided that it defines a region from which light is emitted. In an exemplary embodiment, tire light-emitting region PXA may be defined to correspond to the portion of the anode AE exposed by the opening OP-1.

A hole control layer HCL may be provided in both of the light-emitting region PXA and the non-light-emitting region NPXA. For example, the hole control layer HCL may extend in the first direction DR1 from the light-emitting region PXA to the non-light-emitting region NPXA. Although not shown, a common layer, such as the hole control layer HCL, may be commonly formed in a plurality of pixels.

A light emitting layer EML may be disposed on the hole control layer HCL. The light emitting layer EML may be disposed on only a region corresponding to the opening OP-1. For example, the light emitting layer EML may be divided into a plurality of separate patterns that are formed in the plurality of pixels, respectively.

In an exemplary embodiment, the light emitting layer EML may include an organic or inorganic material, which is used as the light-emitting material. For example, the light emitting layer EML may include at least one of an organic compound or an organic metal compound, as the light-emitting material. Alternatively, the light emitting layer EML may include a quantum dot, which is used as the light-emitting material.

An electron control layer ECL may be disposed on the light emitting layer EML. A cathode CE may be disposed on the electron control layer ECL. The cathode CE may be disposed in common in the plurality of pixels.

In the exemplary embodiment shown in FIG. 12B, the light emitting layer EML is illustrated to have a patterned structure. However, in another exemplary embodiment of the present inventive concepts, the light emitting layer EML may be disposed in common in a plurality of pixels. In an exemplary embodiment, the light emitting layer EML may be configured to emit a white- or blue-color light. In an exemplary embodiment, the light emitting layer EML may have a multi-layered structure. However, exemplary embodiments of the present inventive concepts are not limited thereto.

In the present exemplary embodiment, the encapsulation layer TFE may directly cover the cathode CE. In an exemplary embodiment, a capping layer may be further disposed to cover the cathode CE. In this embodiment, the encapsulation layer TFE may directly cover the capping layer. The encapsulation layer TFE may include an organic layer containing an organic material and an inorganic layer containing an inorganic material. In an exemplary embodiment, the encapsulation layer TFE may cover a side surface of the emission element layer DL. In an exemplary embodiment, the base layer BL of the display panel DP may be omitted.

A connection substrate PCB may be provided in the form of a flexible film. The connection substrate PCB may be, for example, a flexible printed circuit board (FPCB). However, exemplary embodiments of the present inventive concepts are not limited thereto.

The connection substrate PCB may electrically connect the display panel DP with a driving substrate DRP. An end portion of the connection substrate PCB may be electrically connected to the display panel DP through an adhesive conductive film ACF, and another end portion of the connection substrate PCB may be electrically connected to the driving substrate DRP through the adhesive conductive film ACF. In an exemplary embodiment, the adhesive conductive film ACF may be an anisotropic conductive film. However, exemplary embodiments of the present inventive concepts are not limited thereto.

The driving substrate DRP may provide an image data, a control signal, a power voltage, etc. to the display panel DP. Hie driving substrate DRP may be a flexible interconnection substrate or a rigid interconnection substrate. In an exemplary embodiment, the driving substrate DRP may be a driving circuit. In certain exemplary embodiments, the driving substrate DRP may be a substrate, on which a driving circuit is mounted.

As shown in the exemplary embodiment of FIG. 12A, the display panel DP may be wound on the second roller RM2 and the driving substrate DRP may be positioned in the second roller RM2. The second roller RM2 may define an internal space in which the driving substrate DRP and at least a portion of the connection substrate PCB are stored. In an exemplary embodiment, a coupling opening RHM to which the connection substrate PCB is coupled, may be defined in a portion of the second roller RM2. The connection substrate PCB may be received through the coupling opening RHM and may extend (e.g., in the first direction DR1) to the driving substrate DRP.

Since the driving substrate DRP is positioned in the second roller RM2, it may be possible to omit an additional member to cover the driving substrate DRP and an additional member to fasten the display module DM and the second roller RM2.

Figure 13:
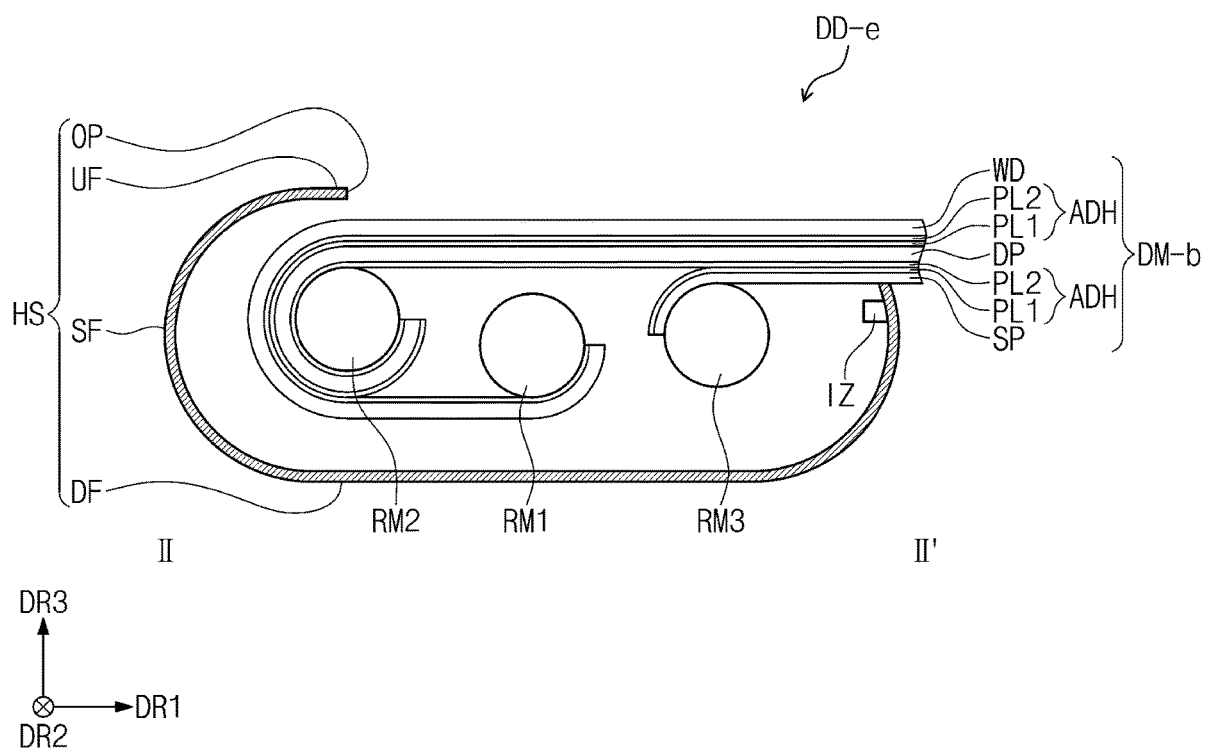
FIG. 13 is a cross-sectional view taken along line II-II' of FIG. 1 illustrating a display device according to an exemplary embodiment of the present inventive concepts.

FIG. 13 is a cross-sectional view taken along line II-II' of FIG 1. illustrating a portion of the display device DD-e. Referring to FIG. 13, the display device DD-e may further include an ion-generation part IZ. The ion-generation pan IZ may emit positive ions and/or negative ions. Although not illustrated in the drawings, the ion-generation pan IZ may include a discharging part to generate ions. In an exemplary embodiment in which an electric current of high voltage is applied to the discharging part, positive and/or negative ions may be generated. When the display module DM is inserted in the housing HS, the positive and/or negative ions generated by the discharging part may be provided to the display module DM-b. For example, the positive and negative ions may be provided to the display module DM-b by an air current containing the ions generated by the ion-general ion part IZ. The positive and/or negative ions provided to the display module DM-b may diminish an electrostatic force between the first and second polymer layers PL1 and PL2, and thus, it may be possible to easily separate the first and second polymer layers PL1 and PL2 from each other.

The ion-generation part IZ may be disposed on the housing HS. For example, as shown in the exemplary embodiment of FIG. 13, the ion-generation part IZ may be disposed on a surface of the side frame SF. In an exemplary embodiment, the ion-generation part IZ may be disposed inside or outside the housing HS. However, exemplary embodiments of the present inventive concepts are not limited thereto, and the position of the ion-generation part IZ may be variously modified provided that the ion-generation part IZ is disposed to easily provide the positive and/or negative ions to an integrated display module.

In an exemplary embodiment, the adhesion layer ADH may include the first polymer layer PL1, which has positive charges, and the second polymer layer PL2, which is disposed on the first polymer layer PL1 and has negative charges. Therefore, it may be possible to reduce the cracking of the display panel DP. the window WD, and the supporting substrate SP and to improve the operational reliability of the display device DD.

According to an exemplary embodiment of the present inventive concept, a display device may include polymer layers, which are disposed between members of a display module, and have opposite electric charges. Thus, it may be possible to reduce a stress, which is applied to each member or element of the display module during a rolling operation, and this may make it possible to improve an operational reliability of a rollable display device.

While exemplary embodiments of the present inventive concepts have been particularly shown and described, it will be understood by one of ordinary skill in the art that variations in form and detail may be made therein without departing from the spirit and scope of the attached claims.

What is claimed is:

1. A display device, comprising:
a display module;
a housing;
at least one roller disposed in the housing, wherein the display module is configured to be wound on the at least one roller and to be inserted and drawn from the housing;
wherein the display module comprises:
a display panel;
a window on the display panel; and
an adhesion layer between the display panel and the window, the adhesion layer comprising:
a first polymer layer having positive charges; and
a second polymer layer having negative charges, the second polymer layer is directly disposed on the first polymer layer.

2. The display device of claim 1, wherein the adhesion layer is directly disposed between the display panel and the window.

3. The display device of claim 1, wherein the first polymer layer comprises a cation polymer that is obtained by polymerizing at least one selected from monomers including a styrene group, a diene group, an acrylate group, an aldehyde group, an epoxide group, an acrylonitrile group, or a cyanoacryl group.

4. The display device of claim 1, wherein the second polymer layer comprises an anion polymer that is obtained by polymerizing at least one selected from monomers including an isobutylene group, a styrene group, a diene group, or a vinylalkylether.

5. The display device of claim 1, wherein the adhesion layer further comprises:
an anion layer disposed directly on a first surface of the first polymer layer;
a second surface of lire first polymer layer that is opposite the first surface of the first polymer layer,
the second surface of the first polymer layer that is disposed directly on a second surface of the second polymer layer; and
a cation layer that is disposed directly on a first surface of the second polymer layer that is opposite the second surface of the second polymer layer.

6. The display device of claim 5, wherein the anion layer comprises at feast one of $OH^-$, $O^-$ and $O_2^-$.

7. The display device of claim 5, wherein the cation layer comprises at least one of $F^+$, $O^+$, $O_2^+$, $H^+$, and $N_2^+$.

8. The display device of claim 1, wherein:
the at least one roller solely includes a first roller; and
the display panel and the window are both configured to be wound on the first roller.

9. The display device of claim 8, further comprising at least one supplementary roller, that is spaced apart from the first roller and is configured to guide the display module.

10. The display device of claim 1, wherein the housing comprises:
a lower frame;
an upper frame opposite to the lower frame, the upper frame defining an opening from which the display module is inserted and drawn; and
a side frame disposed between the lower frame and the upper frame.

11. The display device of claim 10, further comprising:
a supporting substrate that is configured to support the display module; and
the at least one roller comprises a first roller, a second roller and a third roller,
wherein the adhesion layer is further disposed between the display module and the supporting substrate,
wherein the window is configured to be wound on the first roller;

wherein the display panel is configured to be wound on the second roller; and wherein the supporting substrate is configured to be wound on the third roller.

12. The display device of claim 11, wherein the adhesion layer is directly disposal between the display panel and the window and between the supporting substrate and the display panel, wherein:

when the display module is inserted into the housing, the first polymer layer and the second polymer layer are configured to be separated from each other, and the display panel, the window, and the supposing substrate are configured to be spaced apart from each other, and when the display module is drawn from the housing, the first polymer layer and the second polymer layer are configured to adhere to each other, and the display panel, the window, and the supporting substrate are configured to combine to each other to form a single object.

13. The display device of claim 11, wherein the first to third rollers are spaced apart from each other in a first direction, which is a drawing direction of the display module, the first roller is disposed between the second roller and the third roller, the first roller and the third roller do not overlap with the upper frame in a direction of a thickness of the display device, a distance between the first roller and the second roller is less than a distance between the second roller and the third roller, and at least a portion of the second roller overlaps with the upper frame in the direction of the thickness of the display device.

14. The display device of claim 11, wherein:

the first to third rollers are spaced apart from each other in a thickness direction of the display module, and overlap with at least a portion of the upper frame in the thickness direction of the display module, a first distance between the first roller and the lower frame is less than a second distance between the second roller and the lower frame, and the second distance is less than a third distance between the third roller and the lower frame.

15. A display device, comprising:

a display module including a display panel, a window on the display panel, and an adhesion layer between the display panel and the window;

a housing, the display module configured to be inserted and drawn from the housing;

a first roller disposed in the housing and configured to wind the window thereon; and a second roller disposed in the housing and configured to wind the display panel thereon, wherein the adhesion layer comprises:

a first polymer layer having positive charges; and a second polymer layer having negative charges, the second polymer layer is directly disposed on the first polymer layer.

16. The display device of claim 15, wherein:

when the display module is inserted into the housing, the first polymer layer and the second polymer layer are separated from each other, and the display panel and the window are spaced apart from each other, and when the display module is drawn from the housing, the first polymer layer and the second polymer layer are adhered to each other, and the display panel and the window are combined to form a single object.

17. The display device of claim 15, further comprising:

an ion-generation part disposed on the housing, wherein the ion-generation part provides positive and/or negative ions to the display module when the display module is inserted into the housing.

18. The display device of claim 15, wherein:

the first polymer layer comprises a cation polymer that is obtained by polymerizing at least one selected from monomers including a styrene group, a diene group, an acrylate group, an aldehyde group, an epoxide group, an acrylonitrile group, or a cyanoacryl group; and the second polymer layer comprises an anion polymer that is obtained by polymerizing at least one selected from monomers including an isobutylene group, a styrene group, a diene group, or a vinylalkylether.

19. The display device of claim 15, wherein the display module comprises:

an anion layer disposed directly on a first surface of the first polymer layer;

a second surface of the first polymer layer that is opposite the first surface of the first polymer layer is disposed directly on a second surface of the second polymer layer; and a cation layer that is disposed directly on a first surface of the second polymer layer that is opposite the second surface of the second polymer layer.

20. The display device of claim 19, wherein:

the anion layer comprises at least one of $OH^-$, $O^-$ and $O_2^-$, and the cation layer comprises at least one of $F^+$, $O^+$, $O_2^+$, $H^+$, $Ar^+$, and $N_2^+$.

* * * * *